(12) United States Patent
Zheng et al.

(10) Patent No.: US 10,112,823 B2
(45) Date of Patent: Oct. 30, 2018

(54) SEMICONDUCTOR STRUCTURES AND FABRICATION METHOD THEREOF

(71) Applicant: Semiconductor Manufacturing International (Shanghai) Corporation, Shanghai (CN)

(72) Inventors: Chao Zheng, Shanghai (CN); Wei Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 122 days.

(21) Appl. No.: 14/933,099

(22) Filed: Nov. 5, 2015

(65) Prior Publication Data
US 2016/0194198 A1 Jul. 7, 2016

(30) Foreign Application Priority Data
Jan. 7, 2015 (CN) .......................... 2015 1 0006925

(51) Int. Cl.
*H01L 21/00* (2006.01)
*B81B 3/00* (2006.01)

(52) U.S. Cl.
CPC ........ *B81B 3/0072* (2013.01); *B81B 2203/04* (2013.01)

(58) Field of Classification Search
CPC .................................................. B81B 3/0072

USPC ............................................. 257/418; 438/53
See application file for complete search history.

(56) References Cited

U.S. PATENT DOCUMENTS

| | | | |
|---|---|---|---|
| 2004/0060898 A1* | 4/2004 | Tsai ................... | B81C 99/0065 216/2 |
| 2010/0044808 A1* | 2/2010 | Dekker .............. | B81C 1/00047 257/415 |
| 2014/0284730 A1* | 9/2014 | Saito .................... | B81B 3/0086 257/415 |

FOREIGN PATENT DOCUMENTS

CN          103000410 A        3/2013

* cited by examiner

*Primary Examiner* — Ajay K Arora
(74) *Attorney, Agent, or Firm* — Anova Law Group, PLLC

(57) ABSTRACT

A method for forming a MEMS device is provided. The method includes providing a first wafer and a second wafer. The first wafer has a trench on a top surface of the first wafer and a fixed electrode on the bottom of the trench, and the second wafer has a polishing stop layer, a sacrificial layer, and a movable electrode. The method also includes bonding the first wafer and the second wafer with the top surface of the first wafer facing the top surface of the second wafer and the movable electrode on the second wafer located above the trench on the first wafer; removing the second wafer by polishing the second wafer from a backside of the second wafer until reaching the polishing stop layer; and releasing the movable electrode by removing a portion of the polishing stop layer and the sacrificial layer to form the MEMS device.

20 Claims, 9 Drawing Sheets

SEMICONDUCTOR STRUCTURES AND FABRICATION METHOD THEREOF

CROSS-REFERENCES TO RELATED APPLICATIONS

This application claims the priority of Chinese patent application No. 201510006925.1, filed on Jan. 7, 2015, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

Starting in the late 1980s, along with the development of the Micro Electro Mechanical Systems (MEMS) technology, some semiconductor devices such as many sensors became a major direction of future development because microminiaturization and batch production of such devices had been realized.

According to the current technology, multilayer materials are usually deposited at a single wafer and then fixed electrodes of MEMS devices and movable electrodes suspended in cavities of the MEMS devices may be further formed. Practical studies indicate that deposition of multi-layer materials on a single wafer mentioned above may induce considerably large stress and if the stress is not completely released, it may result in bow of the wafer used to form the MEMS devices. Specifically, the large stress in the multi-layer structure leads to deviation of the center point of the MEMS device from the surface of the reference plane away from the device region. The deviation is known as wafer bow. If subsequent processes are required to be performed on the bowed wafer, a mechanical arm is needed to grab the wafer. The principle of grabbing a wafer using a mechanical arm in the current technology is that after the wafer is placed on the loading surface of the mechanical arm, the interface between the wafer and the arm is pumped and the wafer may then be held on the mechanical arm by vacuum generated at the interface. A bowed wafer may cause a failure of the vacuum at the interface between the wafer and the mechanical arm, thus interrupts the fabrication process.

In view of the above, the present disclosed invention provides a new fabrication method for MEMS devices to avoid the abovementioned problem in the fabrication process due to wafer bow.

BRIEF SUMMARY OF THE DISCLOSURE

The present disclosure includes a method for fabricating a MEMS device. The method includes providing a first wafer and a second wafer. The first wafer has a trench on a top surface of the first wafer and a fixed electrode on the bottom of the trench, and the second wafer has a polishing stop layer, a sacrificial layer, and a movable electrode on a top surface of the second wafer. The method also includes bonding the first wafer and the second wafer with the top surface of the first wafer facing the top surface of the second wafer and the movable electrode on the second wafer located above the trench on the first wafer; removing the second wafer by polishing the second wafer from a backside of the second wafer until reaching the polishing stop layer; and releasing the movable electrode by removing a portion of the polishing stop layer and the sacrificial layer to form the MEMS device.

The present disclosure includes a MEMS device. The MEMS device includes a first wafer having a trench on a top surface of the first wafer and a fixed electrode on the bottom of the trench; and a movable electrode formed on a sacrificial layer and a polishing stop layer bonded to the first wafer. The movable electrode is formed through a second wafer as a base of the polishing stop layer, the sacrificial layer, and the movable electrode, such that the movable electrode is located above the trench on the first wafer. The MEMS device also includes a first metal interconnect structure electrically connected to the fixed electrode; and a second metal interconnect structure formed through the sacrificial layer and the polishing stop layer and electrically connected to the movable electrode to lead out electric signals from the movable electrode. The movable electrode is released by removing a portion of the sacrificial layer contacting the movable electrode through an opening in the polishing stop layer to form the MEMS device.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 17:
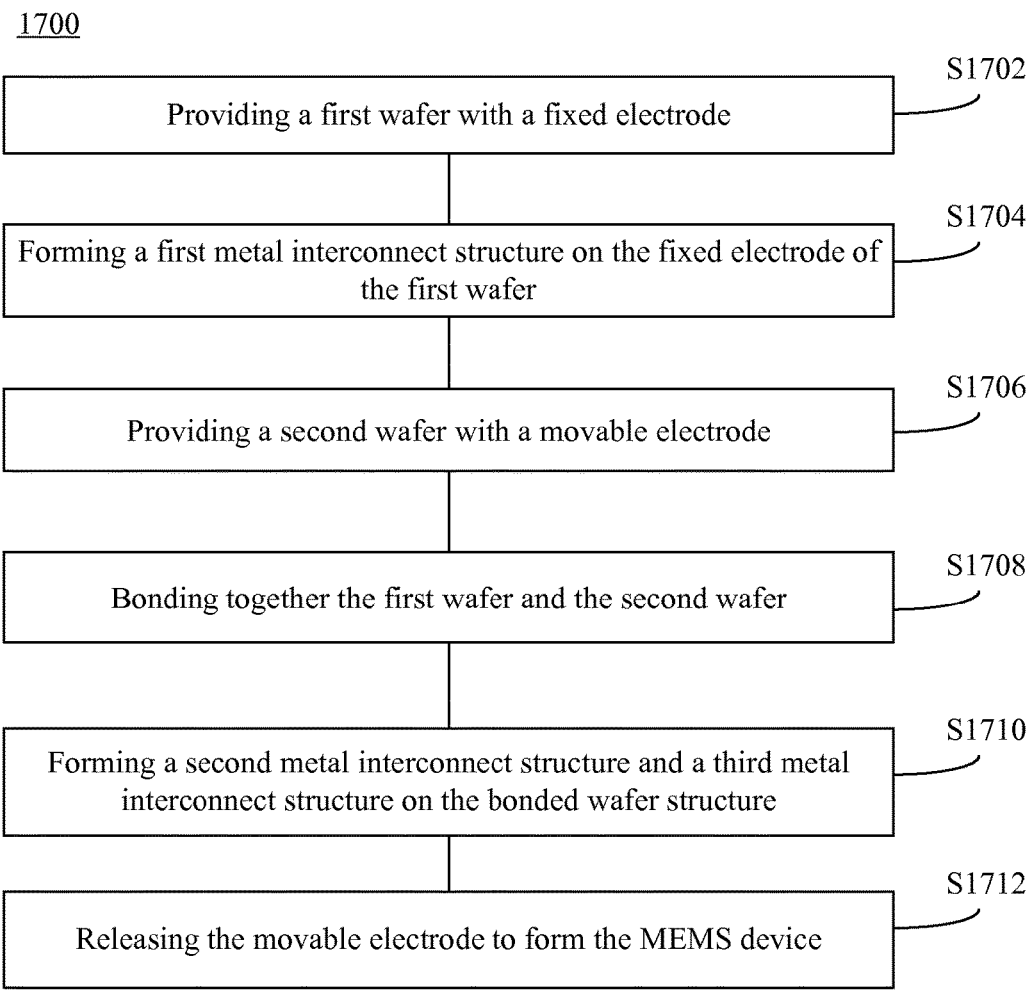
FIG. 17 illustrates an exemplary fabrication process of a MEMS device consistent with the disclosed embodiments.

FIG. 17 illustrates an exemplary fabrication process of a MEMS device consistent with the disclosed embodiments. FIGS. 1~10 illustrate the semiconductor structures corresponding to certain stages of the fabrication process of the MEMS device.

Figure 1:
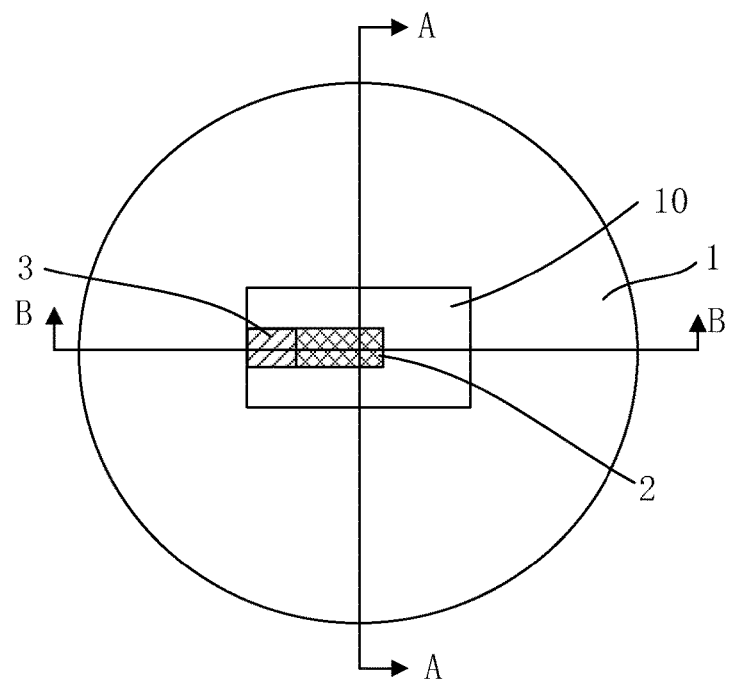
FIG. 1 illustrates a top view of an exemplary first wafer consistent with the disclosed embodiments.

As shown in FIG. 17, at the beginning of the fabrication process 1700 of the MEMS device, a first wafer is provided (S1702). FIG. 1 shows a corresponding structure, FIG. 2 is a cross-section view along the A-A line, and FIG. 3 is a cross-section view along the B-B line.

Figure 2:
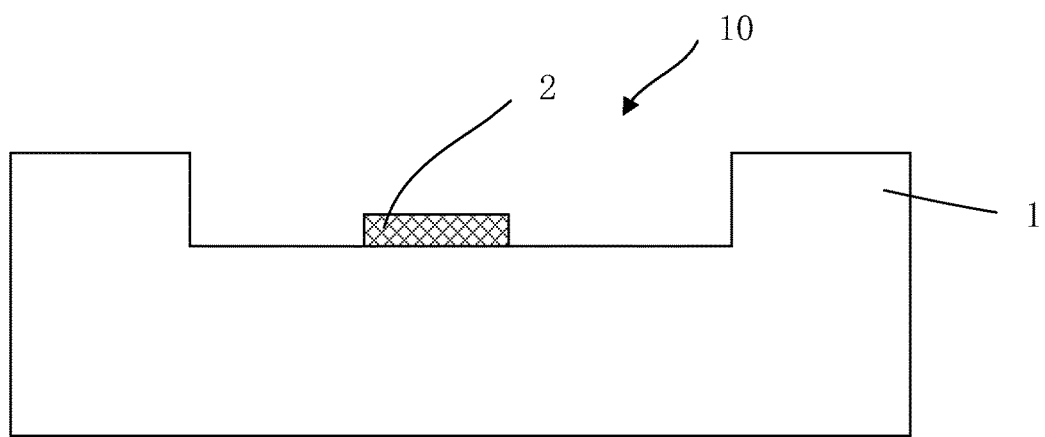
FIG. 2 illustrates a cross-section view of FIG. 1 along the A-A line consistent with the disclosed embodiments.
Figure 3:
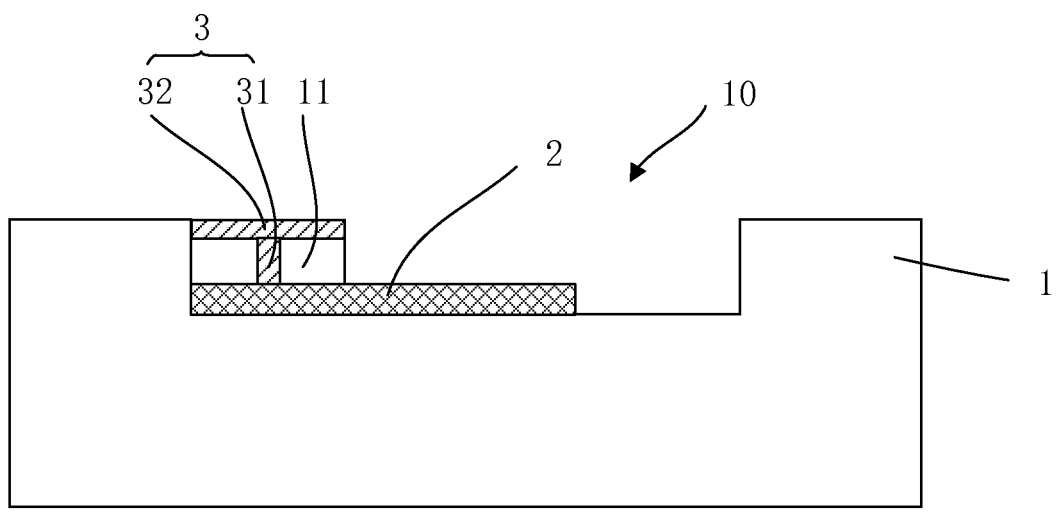
FIG. 3 illustrates a cross-section view of FIG. 1 along the B-B line consistent with the disclosed embodiments.

As shown in FIGS. 1-3, a first semiconductor wafer 1 is provided. The first wafer 1 may be made of any appropriate materials, such as silicon, monocrystalline silicon, polycrystalline silicon, silicon on insulator (SOI), germanium on insulator (GOI) silicon germanium, carborundum, indium antimonide, lead telluride, indium arsenide, indium phosphide, gallium arsenidie, gallium nitride, gallium antimonite, or glass, etc. In one embodiment, the first wafer 1 is made of monocrystalline silicon, i.e., a monocrystalline silicon wafer.

A trench 10 may be formed in a top surface of the first wafer 1. The trench 10 may be formed by any appropriate processes. For example, the trench 10 may be formed by a photolithography or dry etching method. A depth of the trench 10 may be in a range of approximately 3.5~5.0 µm.

Further, a fixed electrode 2 is formed on the bottom of the trench 10. The fixed electrode 2 may be made of any metal material. For example, the fixed electrode 2 may be made of Al or Cu. When the fixed electrode 2 is made of Al, a photolithography or dry etching method may be used to fabricate the fixed electrode 2; when the fixed electrode 2 is made of Cu, a Damascene process may be used to form the fixed electrode 2.

Returning to FIG. 17, to lead out the electric signal of the fixed electrode, a first metal interconnect structure 11 is formed on the fixed electrode 2 (S1704). FIGS. 1-3 show the corresponding structure.

As shown in FIGS. 1-3, at first metal interconnect structure 3 is formed on the fixed electrode 2. A first dielectric layer 11 may be formed first on the top of the fixed electrode 2, and the first metal interconnect structure 3 is formed in the first dielectric layer 11.

The first metal interconnect structure 3 may include a conductive plug 31 that connects to the fixed electrode 2 and a metal wire pattern 32 that connects to the conductive plug 31. To facilitate leading out the electric signal of the fixed electrode 2 through the surface of a sacrificial layer in the subsequently-formed MEMS device, the metal wire pattern 32 may be leveled with the opening of the trench 10. The first dielectric layer 11 may be made of $SiO_2$, the conductive plug 31 may be made of W, and the metal wire pattern 32 may be made of Cu.

In certain embodiments, part of the surface of the fixed electrode 2 may be exposed in the trench 10 while the other part is covered by the first dielectric layer 11. That is, the first dielectric layer 11 partially covers the fixed electrode 2. In certain other embodiments, the first dielectric layer 11 may fully cover the fixed electrode 2.

Thus, according to the present disclosure, the first metal interconnect structure 3 includes the conductive plug 31 formed in the first dielectric layer 11 and the metal wire pattern 32. In certain embodiments, the metal wire pattern 32 may also be formed directly on the fixed electrode 2, and the metal wire pattern 32 may also be made of the same material as the fixed electrode 2. That is, the metal wire pattern 32 is a protrusion on top of the fixed electrode 2. The metal wire pattern 32 and the fixed electrode 2 in such a structure may be made of Al, and may be formed by a two-step Al deposition and a dry etching process. The metal wire pattern 32 and the fixed electrode 2 in such a structure may be made of Cu, and may be formed in a dual Damascene process.

Figure 4:
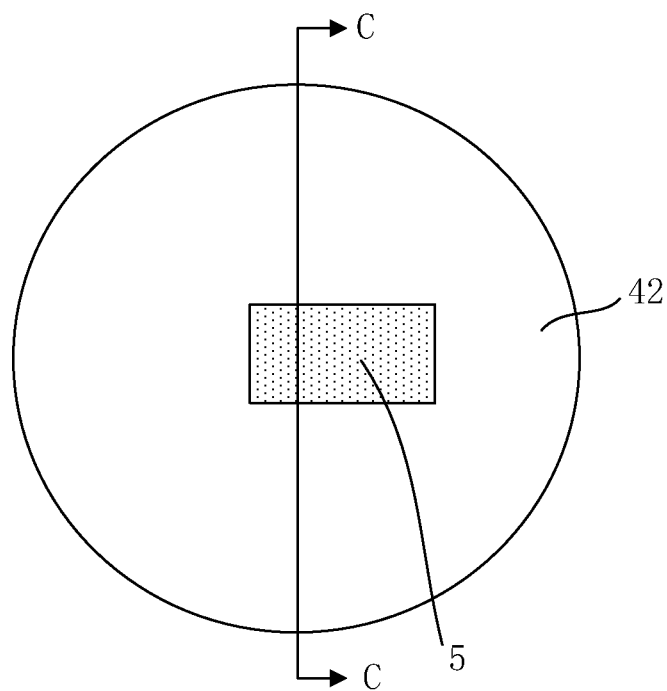
FIG. 4 illustrates a top view of an exemplary second wafer consistent with the disclosed embodiments.
Figure 5:
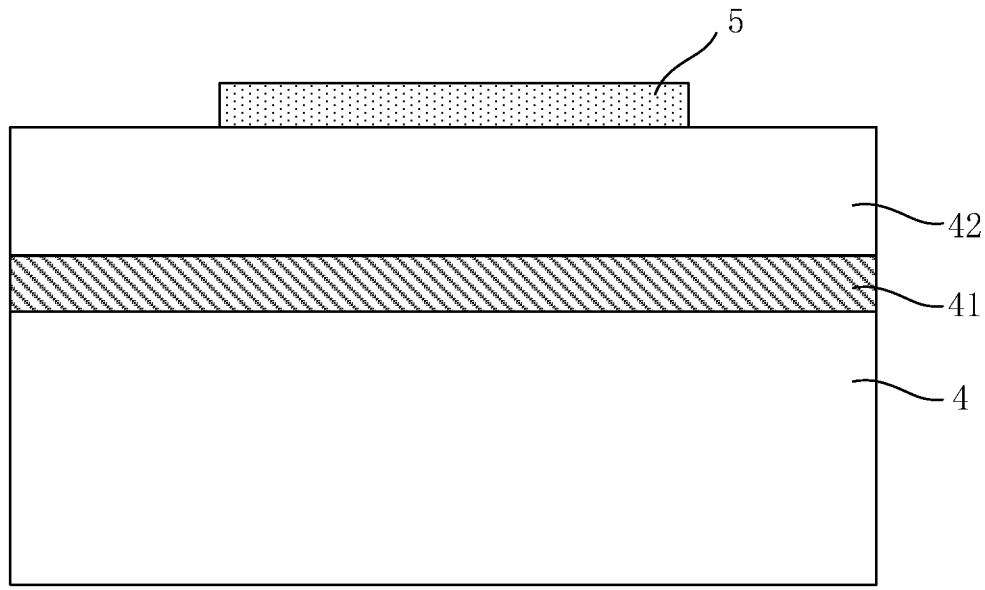
FIG. 5 illustrates a cross-section view of FIG. 4 along the C-C line consistent with the disclosed embodiments.

Returning to FIG. 17, a second wafer may also be provided (S1706). FIG. 4 and FIG. 5 illustrate the corresponding structure. FIG. 4 shows a top view of the second wafer; FIG. 5 illustrates the cross-section view of FIG. 4 along the C-C line.

As shown in FIG. 4 and FIG. 5, a second wafer 4 is provided. The second wafer 4 may be made of any appropriate materials, such as silicon, monocrystalline silicon, polycrystalline silicon, silicon on insulator (SOI), germanium on insulator (GOI) silicon germanium, carborundum, indium antimonide, lead telluride, indium arsenide, indium phosphide, gallium arsenidie, gallium nitride, gallium antimonite, or glass, etc. In one embodiment, the second wafer 4 is made of monocrystalline silicon, i.e., a monocrystalline silicon wafer.

After the second wafer 4 is provided, a polishing stop layer 41 may be formed on a top surface of the second wafer 4, and a sacrificial layer 42 may be formed on the top of the polishing stop layer 41. Further, a device layer (not shown) may be formed on the sacrificial layer 42.

The polishing stop layer 41 may be made of SiN or SiON, and the sacrificial layer 42 may be made of $SiO_2$ or amorphous carbon. The device layer may be made of polycrystalline silicon. Further, portion of the device layer may be removed to form a movable electrode. The portion of the device layer may be removed by any appropriate processes, such as a photolithography process or a dry etching process.

Further, after the portion of the device layer is removed, a movable electrode 5 may be formed on the second wafer 4. Specifically, the movable electrode 5 may be formed on the sacrificial layer 42.

Figure 6:
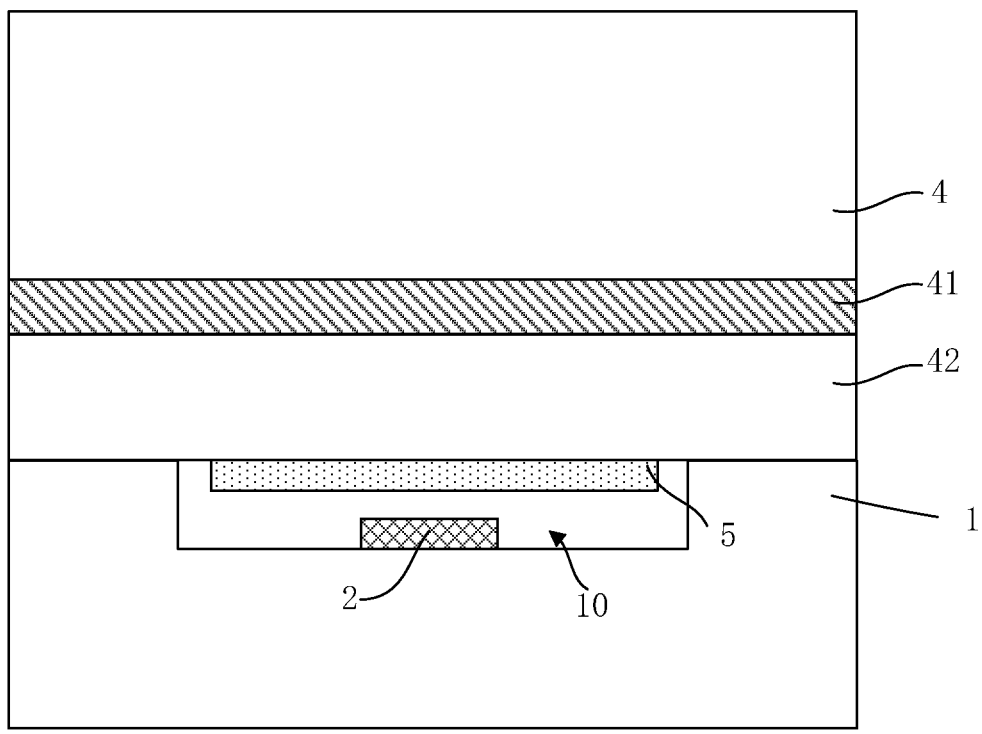
FIG. 6 illustrates exemplary bonding of the first wafer and the second wafer consistent with the disclosed embodiments.

Returning to FIG. 17, the first wafer 1 and the second wafer 4 may be bonded together (S1708). FIG. 6 illustrates the corresponding structure.

As shown in FIG. 6, after the separate fabrication processes are performed on the first wafer 1 and the second wafer 4, the first wafer 1 and the second wafer 4 are bonded together to create a bonded structure. For example, the first wafer 1 may be used as the bottom wafer of the bonded structure with the top surface facing up while the second wafer 4 may be placed as the top wafer with the top surface facing down. Thus, the movable electrode 5 of the second wafer 4 is located directly above the trench 10 of the first wafer 1 and, more particularly, above the fixed electrode 2.

Further, during the wafer bonding process, the sacrificial layer 42 on the second wafer 4 may be bonded to the surface of the first wafer 1. Practical studies indicate that the strength of the bonding may be desired when the wafer bonding is performed at a temperature in a range of 25° C.~100° C. and under a pressure in a range of 1000N~2000N.

Figure 7:
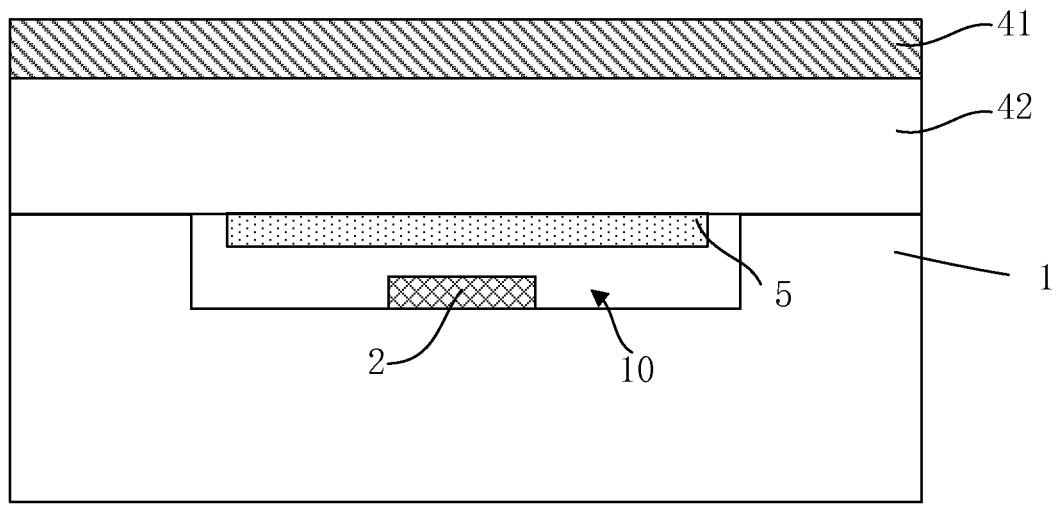
FIG. 7 illustrates a cross-section view of the bonded structure in FIG. 6 after removal of the second wafer consistent with the disclosed embodiments.
Figure 8:
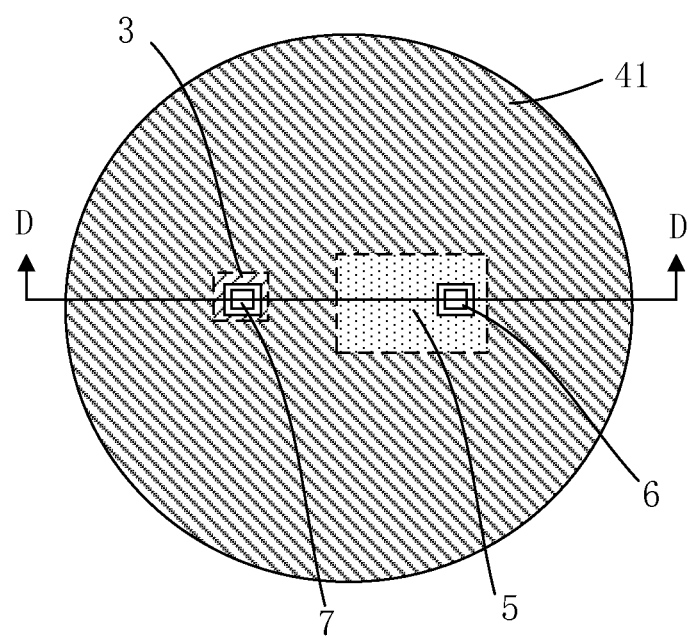
FIG. 8 illustrates a top view of the bonded structure with a second metal interconnect structure and a third metal interconnect structure consistent with the disclosed embodiments.
Figure 9:
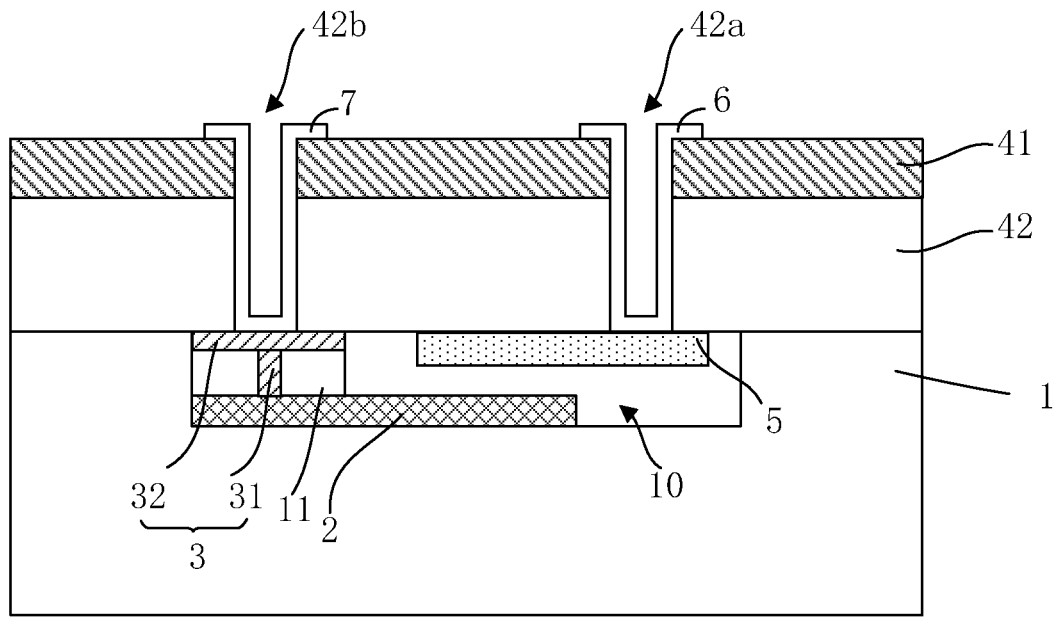
FIG. 9 illustrates a cross-section view of FIG. 8 along the D-D line consistent with the disclosed embodiments.

Returning to FIG. 17, after the first wafer 1 and the second wafer 4 are bonded together, a second metal interconnect structure and a third metal interconnect structure may be formed (S1710). FIGS. 7-9 illustrate the corresponding structure.

As shown in FIG. 7, after the first wafer 1 and the second wafer 4 are bonded together, a chemical-mechanical polishing (CMP) process may be used to polish the second wafer 4 from its backside until reaching the polishing stop layer 41. That is, after performing the CMP process, the backside portion of the second wafer 4 is removed and the polishing stop layer 41 is exposed.

As shown in FIG. 8 and FIG. 9, after the backside of the second wafer 4 is polished, the second metal interconnect structure 6 may be formed on the polishing stop layer 41 and through both the polishing stop layer 41 and the sacrificial layer 42 to connect with the movable electrode 5. Similarly, the third metal interconnect structure 7 may be formed on the polishing stop layer 41 and through both the polishing stop layer 41 and the sacrificial layer 42 to connect with the fixed electrode 3.

More specifically, to form the second metal interconnect structure 6, a first trench 42a may be formed in the sacrificial layer 42 and the polishing stop layer 41 to expose the surface of the movable electrode 5. A conducting layer may then be formed on the sidewall of the first trench 42a as well as the top surface of the polishing stop layer 41 outside of the first trench 42a. Further, a patterning process is performed on the conducting layer to form the second metal interconnect structure 6. The second metal interconnect structure 6 is used to lead out the electric signal of the movable electrode 5.

Similarly, in the same process as forming the first trench 42a or a separate process, a second trench 42b may be formed in the sacrificial layer 42 and the polishing stop layer 41 to expose the metal wire pattern 32 of the first metal interconnect structure 3. The conducting layer may also be formed on the sidewall of the second trench 42b as well as the top surface of the polishing stop layer 41 outside of the second trench 42b. Further, the patterning process is performed on the conducting layer to form the third metal interconnect structure 7. The third metal interconnect structure 7 is electrically connected to the first metal interconnect structure 3, leading out the electric signal of the fixed electrode 2 from the top side of the MEMS device.

The first trench 42a and the second trench 42b may be formed by using a photolithography process or a dry etching process. The conducting layer may be made of Al or Au, and the patterning process on the conducting layer may be a photolithography process, a dry etching process (for Al), or a wet etching process (for Au).

Figure 10:
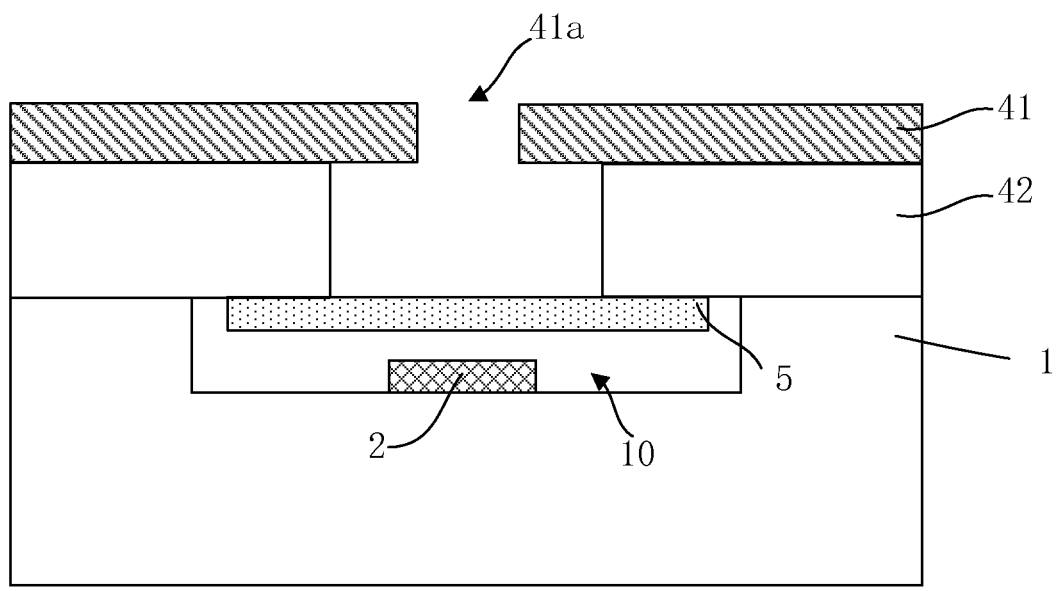
FIG. 10 illustrates a formed MEMS device consistent with the disclosed embodiments.

Returning to FIG. 17, after forming the second metal interconnect structure 6 and the third metal interconnect structure 7, the movable electrode 5 is released (S1712). FIG. 10 illustrates the corresponding structure.

As shown in FIG. 10, an opening 41a is formed in the polishing stop layer 41, and a portion of the sacrificial layer 42 may be removed through the opening 41a to release the movable electrode 5. The MEMS device may be formed.

The opening 41a is formed in the polishing stop layer 41 by using a photolithography process or a dry etching process. In one embodiment, as shown in FIG. 10, only one opening 41a is formed. In certain other embodiments, two or more openings 41a may be formed in the polishing stop layer 41.

As described previously, the sacrificial layer 42 may be made of $SiO_2$ or amorphous carbon. When the sacrificial layer 42 is made of $SiO_2$, an HF acid etching process may be used to remove the portion of the sacrificial layer 42. The amount of the $SiO_2$ to be removed can be controlled by controlling the etching time. With a longer etching time, more sacrificial layer 42 is removed, and more space is left after the etching process.

When the sacrificial layer 42 is made of amorphous carbon, an ashing process may be used to remove the portion of the sacrificial layer 42. Oxygen gas may be flowed onto the sacrificial layer 42 through the opening 41a and the exhaust gas after the ashing process is evacuated by a pumping system. The amount of amorphous C to be removed can be controlled by controlling the ashing time. With a longer ashing time, more sacrificial layer 42 is ashed or removed, and more space is left after the ashing process.

In other embodiments, to control the removed amount of the sacrificial layer 42, a ring of etching stop layer (not shown) may be formed to surround the sacrificial layer 42. The etching stop layer serves as a boundary for the removal of the sacrificial layer 42. For example, during the formation of the sacrificial layer 42 on the polishing stop layer 41, an etching stop layer may also be formed on the polishing stop layer 41. The etching stop layer may be physically in contact with the movable electrode 5. In practical implementations, such an etching stop layer may be made of SiN or SiON. Thus, when an etching stop layer is formed to surround the sacrificial stop layer 42, the bonding of the first wafer 1 and the second wafer 4 may be realized by bonding the etching stop layer of the second wafer 4 with the top surface of the first wafer 1.

Thus, according to the disclosed embodiments, the fixed electrode 2 and the movable electrode 5 are fabricated separately on the first wafer 1 and the second wafer 4, respectively. Compared to forming such electrodes through multi-layer deposition on a single wafer, the disclosed device and method need fewer layers of deposition on each wafer, leading to less stress to avoid the bow of the wafer used to form MEMS devices. That is, two semiconductor wafers are provided, and different fabrication processes are performed separately on each of the two wafers prior to a wafer bonding process to form the MEMS device. Practical studies indicate that using the disclosed MEMS device fabrication method, the wafer bow of the MEMS devices may be controlled to be less than 80 μm. As a comparison, the expected wafer bow for MEMS devices fabricated on a single wafer by multi-layer deposition is over 300 μm.

Figure 11:
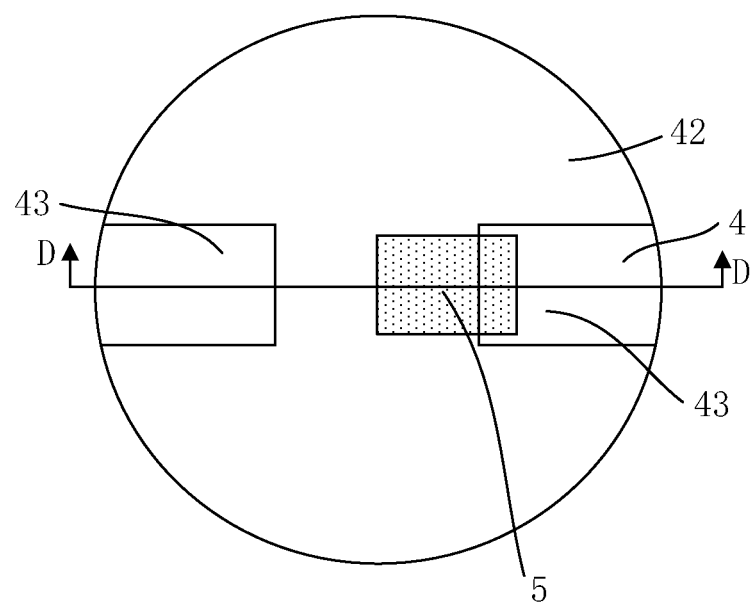
FIG. 11 illustrates a top view of another exemplary second wafer consistent with the disclosed embodiments.
Figure 12:
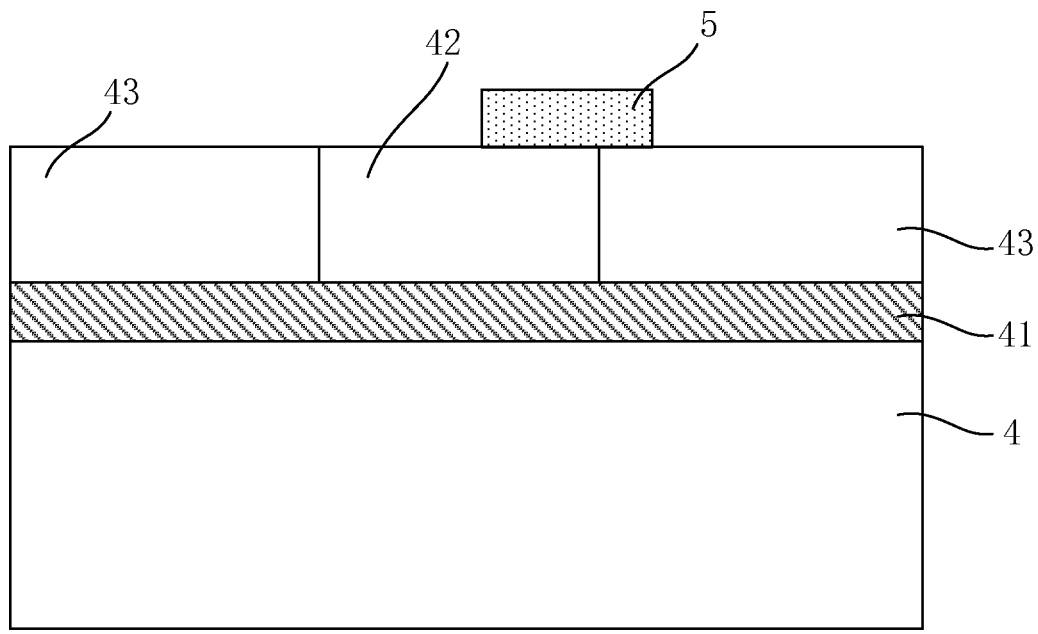
FIG. 12 illustrates a cross-section view of FIG. 11 along the D-D line consistent with the disclosed embodiments.
Figure 13:
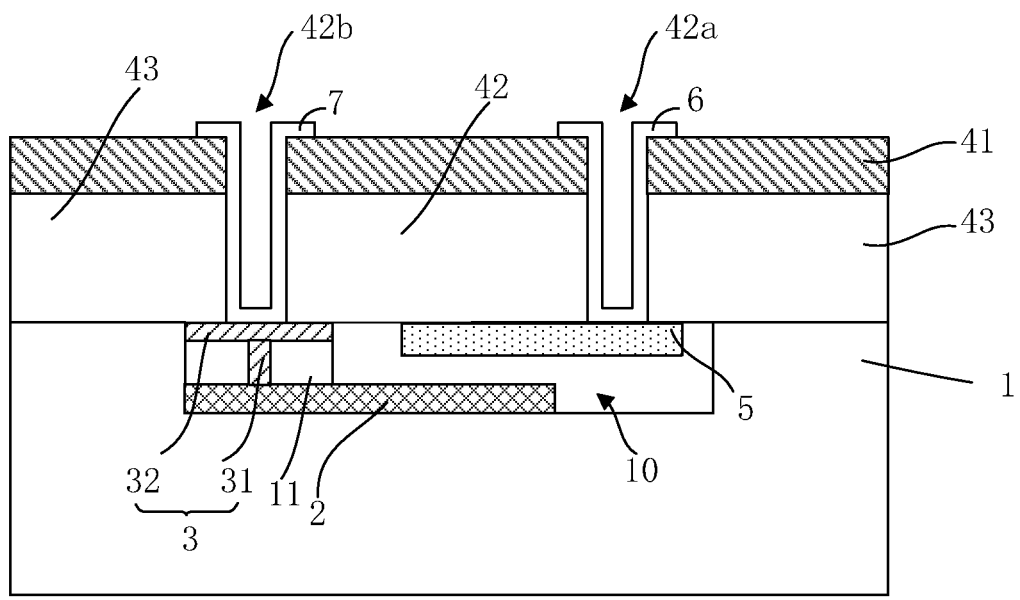
FIG. 13 illustrates a cross-section view of another MEMS device formed by bonding a first wafer shown in FIG. 1 with a second wafer shown in FIG. 11 consistent with the disclosed embodiments.

FIGS. 11~13 illustrate corresponding structures of another exemplary fabrication process, which is similar to the above described fabrication process with respect to FIG. 17 and with certain modifications or additions. FIG. 11 shows a top view of the second wafer 4; FIG. 12 illustrates the cross-section view of FIG. 11 along the D-D line; and FIG. 13 illustrates the cross-section view of forming the second metal interconnect structure 6 and the third metal interconnect structure 7.

As shown in FIGS. 11-12, not only a sacrificial layer 42 but also a second dielectric layer 43 are formed on the polishing stop layer 41. The movable electrode 5 is formed partially on the sacrificial layer 42 and partially on the second dielectric layer 43.

Further, as shown in FIG. 13, after bonding the first wafer 1 and the second wafer 4 and removing the second wafer 4 by a CMP process, the second metal interconnect structure 6 that provides the electric lead to the movable electrode 5 may be formed in the second dielectric layer 43. The third metal interconnect structure 7 that connects to the first metal interconnect structure 3 and provides the electric lead to the fixed electrode 2 may also be formed in the second dielectric layer 43.

Figure 14:
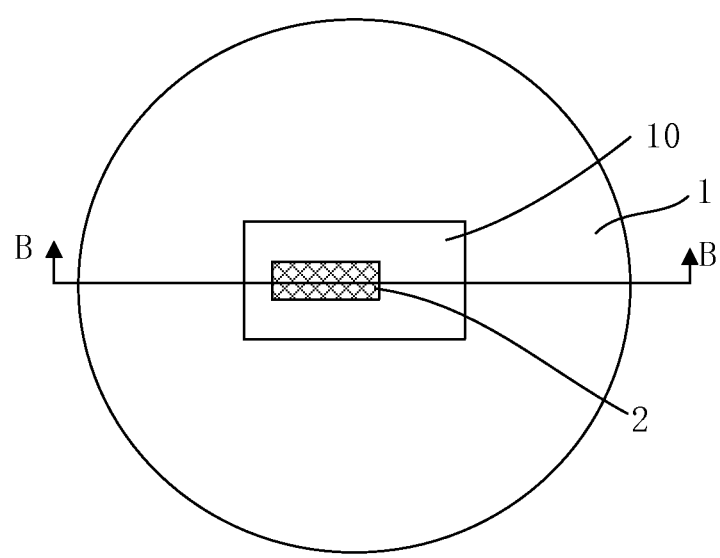
FIG. 14 illustrates a top view of another first wafer consistent with the disclosed embodiments.
Figure 15:
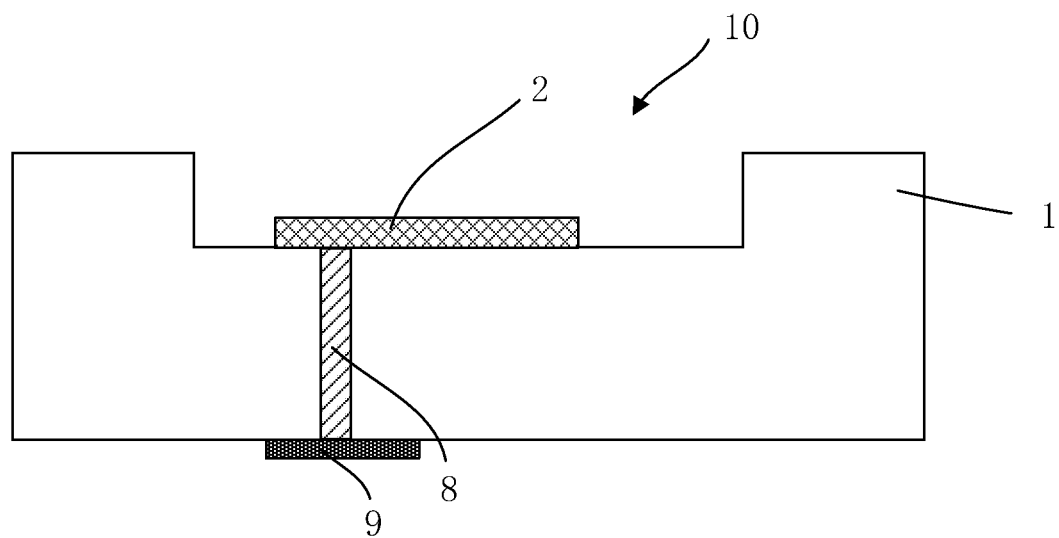
FIG. 15 illustrates a cross-section view of FIG. 14 along the B-B line consistent with the disclosed embodiments.
Figure 16:
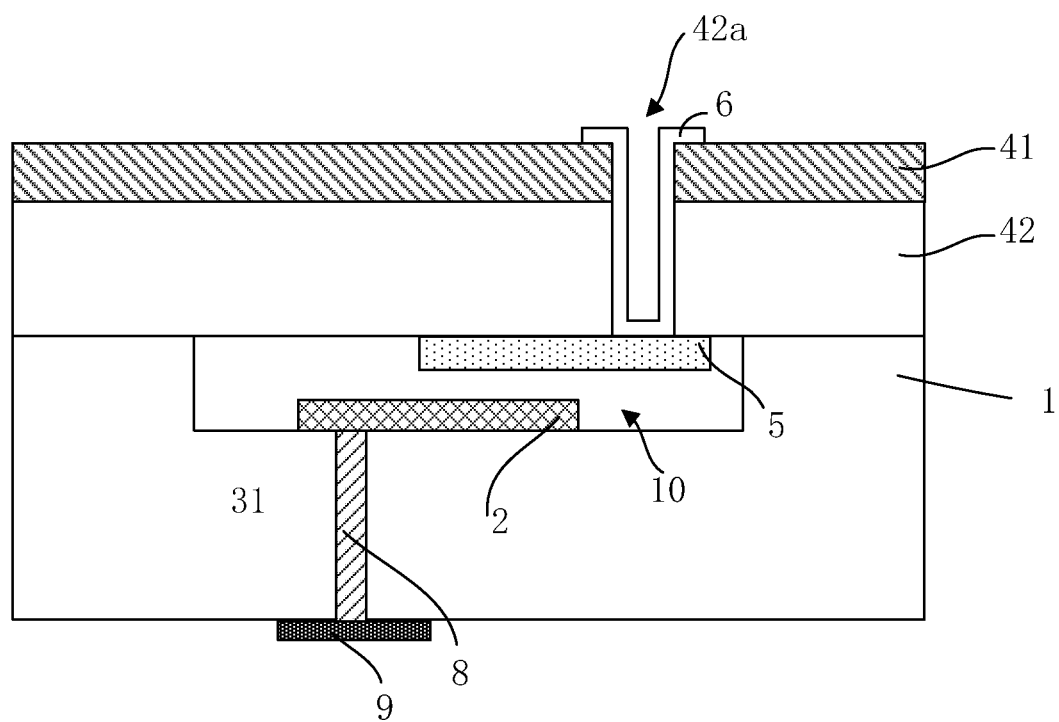
FIG. 16 illustrates a cross-section view of another MEMS device formed by bonding a first wafer shown in FIG. 14 with a second wafer shown in FIG. 4 consistent with the disclosed embodiments.

FIGS. 14~16 illustrate corresponding structures of another exemplary fabrication process, which is similar to the above described fabrication process with respect to FIG. 17 and with certain modifications or additions. FIG. 14 shows a to view of the first wafer 1; FIG. 15 illustrates the cross-section view of FIG. 14 along the B-B line; and FIG. 16 illustrates the cross-section view of forming the second metal interconnect structure 6 without forming the third metal interconnect structure 7.

As shown in FIGS. 14-15, there is no first metal interconnect structure 3 on the fixed electrode 2 at the bottom of the trench 10. That is, the process for forming the first metal interconnect structure 3 is no needed. Instead, a through silicon via structure 8 is formed in the first wafer 1. The through silicon via structure 8 includes a through hole in the silicon wafer and the conducting material filled into the hole. The conducting material may be polycrystalline silicon or other appropriate material. A welding pad 9 may be formed on the backside of the first wafer 1 and covers the opening of the through silicon via structure 6. The welding pad 9 and the through silicon via structure 8 together lead out the electric signal of the fixed electrode 2.

As shown in FIG. 16, after bonding the first wafer 1 and the second wafer 4 and removing the second wafer 4 by a CMP process, the second metal interconnect structure 6 is formed, without forming the third metal interconnect structure 7 in the sacrificial layer 42 or in the second dielectric layer 43. That is, because the first metal interconnect structure 3 is no longer needed, the third metal interconnect structure 7 is also no longer needed. Structures of the MEMS device may be further simplified.

Thus, by using the disclosed structures and methods, the fixed electrode and the movable electrode of a MEMS device can be separately fabricated on two wafers, and fewer layers of materials need to be deposited on a single wafer, causing less stress in the material structures and avoiding issues due to bow of the wafer when forming the MEMS device.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent, or modification thereof, without departing from the spirit and principle of the present invention, falls within the true scope of the present invention.

What is claimed is:

1. A method for fabricating a MEMS device, comprising:
   providing a first wafer having a trench on a top surface of the first wafer and a fixed electrode on the bottom of the trench;
   providing a second wafer with a polishing stop layer, a sacrificial layer, and a movable electrode on a top surface of the second wafer;
   bonding the first wafer and the second wafer with the top surface of the first wafer facing the top surface of the second wafer and the movable electrode on the second wafer located above the trench on the first wafer;
   removing the second wafer by polishing the second wafer from a backside of the second wafer until reaching the polishing stop layer; and
   releasing the movable electrode by removing a portion of the polishing stop layer and the sacrificial layer to form the MEMS device.

2. The method according to claim 1, wherein providing the first wafer further includes:
   forming the trench in the top surface of the first wafer; and
   forming the fixed electrode on the bottom of the trench.

3. The method according to claim 2, further includes:
   forming a first dielectric layer on the fixed electrode; and
   forming a first metal interconnect structure on the first dielectric layer and electrically connected to the fixed electrode by a conductive plug through the first dielectric layer.

4. A method for fabricating a MEMS device, comprising:
   providing a first wafer having a trench on a top surface of the first wafer and a fixed electrode on the bottom of the trench;
   providing a second wafer with a polishing stop layer, a sacrificial layer, and a movable electrode on a top surface of the second wafer, wherein providing the second wafer further includes:
      forming the polishing stop layer on the top surface of the second wafer; and
      forming the sacrificial layer on the polishing stop layer;
      forming a device layer on the sacrificial layer; and
      forming the movable electrode on the sacrificial layer by removing a portion of the device layer;
   bonding the first wafer and the second wafer with the top surface of the first wafer facing the top surface of the second wafer and the movable electrode on the second wafer located above the trench on the first wafer;
   removing the second wafer by polishing the second wafer from a backside of the second wafer until reaching the polishing stop layer; and
   releasing the movable electrode by removing a portion of the polishing stop layer and the sacrificial layer to form the MEMS device.

5. The method according to claim 1, wherein:
   the fixed electrode is made of Al or Cu; and
   the movable electrode is made of polycrystalline silicon;
   the polishing stop layer is made of SiN or SiON; and
   the sacrificial layer is made of $SiO_2$ or carbon.

6. A method for fabricating a MEMS device, comprising:
   providing a first wafer having a trench on a top surface of the first wafer and a fixed electrode on the bottom of the trench;
   providing a second wafer with a polishing stop layer, a sacrificial layer, and a movable electrode on a top surface of the second wafer;
   bonding the first wafer and the second wafer with the top surface of the first wafer facing the top surface of the second wafer and the movable electrode on the second wafer located above the trench on the first wafer, wherein bonding the first wafer and the second wafer further includes:
      bonding the top surface of the first wafer with the sacrificial layer of the second wafer;
   removing the second wafer by polishing the second wafer from a backside of the second wafer until reaching the polishing stop layer; and
   releasing the movable electrode by removing a portion of the polishing stop layer and the sacrificial layer to form the MEMS device.

7. The method according to claim 6, wherein the bonding of the first wafer and the second wafer is performed:
at a temperature in a range of 25° C.~100° C.; and
under a pressure in a range of 1000N~2000N.

8. The method according to claim 3, after bonding the first wafer with the second wafer and removing the second wafer by polishing, further including:
forming a second metal interconnect structure connecting with the movable electrode on the polishing stop layer and through both the polishing stop layer and the sacrificial layer; and
forming a third metal interconnect structure connecting with the first metal interconnect structure and the fixed electrode on the polishing stop layer and through both the polishing stop layer and the sacrificial layer.

9. The method according to claim 1, wherein releasing the movable electrode further includes:
forming an opening in the polishing stop layer above the movable electrode; and
removing a portion of the sacrificial layer contacting with the moveable electrode through the opening in the polishing stop layer to release the movable electrode.

10. The method according to claim 9, wherein the sacrificial layer is made of $SiO_2$ and the method further includes:
removing the portion of the sacrificial layer using an HF acid etching method; and
controlling an amount of the removed sacrificial layer by controlling etching time.

11. The method according to claim 9, wherein the sacrificial layer is made of amorphous carbon and the method further includes:
removing the portion of the sacrificial layer using an ashing method;
controlling an amount of the removed sacrificial layer by controlling ashing time.

12. The method according to claim 4, wherein providing the second wafer further includes:
forming an etching stop layer on the polishing stop layer and within a same layer as the sacrificial layer; and
the etching stop layer is a boundary for removal of the sacrificial layer.

13. The method according to claim 12, wherein bonding the first wafer and the second wafer further includes:
bounding the top surface of the first wafer with the etching stop layer of the second wafer.

14. The method according to claim 2, after forming the trench on the surface of the first wafer and the fixed electrode on the bottom of the trench, further including:
forming a through silicon via structure in the bottom of the trench to electrically connect to the fixed electrode from a backside of the first wafer.

15. The method according to claim 4, after forming the polishing stop layer on the surface of the second wafer, further including:
forming a second dielectric layer in a same layer as the sacrificial layer on top of the polishing stop layer; and
forming the movable electrode partially on the sacrificial layer and partially on the second dielectric layer.

16. The method according to claim 15, after bonding the first wafer with the second wafer, further including:
forming a second metal interconnect structure connecting with the movable electrode on the polishing stop layer and through both the polishing stop layer and the second dielectric layer; and
forming a third metal interconnect structure connecting with the first metal interconnect structure and the fixed electrode on the polishing stop layer and through both the polishing stop layer and the second dielectric layer.

17. The method according to claim 6, further includes:
forming a first dielectric layer on the fixed electrode; and
forming a first metal interconnect structure on the first dielectric layer and electrically connected to the fixed electrode by a conductive plug through the first dielectric layer.

18. The method according to claim 6, wherein releasing the movable electrode further includes:
forming an opening in the polishing stop layer above the movable electrode; and
removing a portion of the sacrificial layer contacting with the moveable electrode through the opening in the polishing stop layer to release the movable electrode.

19. The method according to claim 18, wherein the sacrificial layer is made of $SiO_2$ and the method further includes:
removing the portion of the sacrificial layer using an HF acid etching method; and
controlling an amount of the removed sacrificial layer by controlling etching time.

20. The method according to claim 18, wherein the sacrificial layer is made of amorphous carbon and the method further includes:
removing the portion of the sacrificial layer using an ashing method;
controlling an amount of the removed sacrificial layer by controlling ashing time.

* * * * *